(12) United States Patent
Andre et al.

(10) Patent No.: US 10,037,790 B2
(45) Date of Patent: *Jul. 31, 2018

(54) WORD LINE AUTO-BOOTING IN A SPIN-TORQUE MAGNETIC MEMERY HAVING LOCAL SOURCE LINES

(71) Applicant: Everspin Technologies, Inc., Chandler, AZ (US)

(72) Inventors: Thomas Andre, Austin, TX (US); Syed M. Alam, Austin, TX (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/452,831

(22) Filed: Mar. 8, 2017

(65) Prior Publication Data

US 2017/0178709 A1 Jun. 22, 2017

Related U.S. Application Data

(62) Division of application No. 15/056,486, filed on Feb. 29, 2016, now Pat. No. 9,601,175, which is a division (Continued)

(51) Int. Cl.
*G11C 11/16* (2006.01)
*G11C 7/12* (2006.01)
(Continued)

(52) U.S. Cl.
CPC ...... *G11C 11/1675* (2013.01); *G06F 12/0806* (2013.01); *G06F 12/0879* (2013.01); *G11C 7/1018* (2013.01); *G11C 7/1045* (2013.01); *G11C 7/22* (2013.01); *G11C 11/16* (2013.01); *G11C 11/1655* (2013.01);
(Continued)

(58) Field of Classification Search
CPC . G11C 11/1675; G11C 7/1018; G11C 7/1045; G11C 7/22; G11C 11/16; G11C 11/1655; G11C 11/1657; G11C 11/1659; G11C 11/1673; G11C 11/1693; G11C 7/12; G11C 11/4091; G11C 11/4094;
(Continued)

(56) References Cited

U.S. PATENT DOCUMENTS

| 5,774,392 A | 6/1998 | Kraus et al. |
| 8,792,269 B1 | 7/2014 | Abedifard et al. |

(Continued)

*Primary Examiner* — Ly D Pham
(74) *Attorney, Agent, or Firm* — Bookoff McAndrews, PLLC

(57) ABSTRACT

In a spin-torque magnetic random access memory (MRAM) that includes local source lines, auto-booting of the word line is used to reduce power consumption by reusing charge already present from driving a plurality of bit lines during writing operations. Auto-booting is accomplished by first driving the word line to a first word line voltage. After such driving, the word line isolated. Subsequent driving of the plurality of bit lines that are capacitively coupled to the word line causes the word line voltage to be increased to a level desired to allow sufficient current to flow through a selected memory cell to write information into the selected memory cell. Additional embodiments include the use of a supplemental voltage provider that is able to further boost or hold the isolated word line at the needed voltage level.

20 Claims, 8 Drawing Sheets

Related U.S. Application Data of application No. 14/495,151, filed on Sep. 24, 2014, now Pat. No. 9,286,218.

(60) Provisional application No. 61/950,501, filed on Mar. 10, 2014.

(51) Int. Cl.

| | | |
|---|---|---|
| *G11C 7/08* | (2006.01) | |
| *G06F 12/0806* | (2016.01) | |
| *G06F 12/0879* | (2016.01) | |
| *G11C 7/10* | (2006.01) | |
| *G11C 7/22* | (2006.01) | |
| *G11C 11/4094* | (2006.01) | |
| *G11C 11/419* | (2006.01) | |
| *G11C 11/4091* | (2006.01) | |
| *G11C 11/56* | (2006.01) | |

(52) U.S. Cl.
CPC ...... *G11C 11/1657* (2013.01); *G11C 11/1659* (2013.01); *G11C 11/1673* (2013.01); *G11C 11/1693* (2013.01); *G06F 2212/62* (2013.01); *G11C 7/12* (2013.01); *G11C 11/4091* (2013.01); *G11C 11/4094* (2013.01); *G11C 11/419* (2013.01); *G11C 11/5607* (2013.01); *Y02D 10/13* (2018.01)

(58) Field of Classification Search
CPC ............... G11C 11/419; G11C 11/5607; G06F 12/0806; G06F 12/0879; Y02B 60/1225
USPC ........................................................ 365/158
See application file for complete search history.

(56) References Cited

U.S. PATENT DOCUMENTS

| | | |
|---|---|---|
| 9,286,218 B2 | 3/2016 | Andre et al. |
| 9,401,194 B2 | 7/2016 | Abedifard et al. |
| 9,558,802 B2 | 1/2017 | Abedifard et al. |
| 9,601,175 B2 | 3/2017 | Andre et al. |
| 9,691,464 B2 | 6/2017 | Abedifard et al. |
| 9,786,344 B1 | 10/2017 | Abedifard et al. |
| 9,858,977 B1 | 1/2018 | Abedifard et al. |
| 2009/0039335 A1 | 2/2009 | Terao et al. |
| 2011/0188281 A1 | 8/2011 | Siau et al. |

WORD LINE AUTO-BOOTING IN A SPIN-TORQUE MAGNETIC MEMERY HAVING LOCAL SOURCE LINES

CROSS REFERENCE TO RELATED APPLICATIONS

This application is a divisional of U.S. application Ser. No. 15/056,486 filed Feb. 29, 2016. Application Ser. No. 15/056,486 is a divisional of U.S. patent application Ser. No. 14/495,151 filed Sep. 24, 2014, which issued as U.S. Pat. No. 9,286,218 on Mar. 15, 2016. This application and application Ser. Nos. 15/056,486 and 14/495,151 claim priority to and the benefit of U.S. Provisional Application No. 61/950,501 filed Mar. 10, 2014. The contents of application Ser. Nos. 61/950,501, 14/495,151, and 15/056,486 are incorporated by reference herein in their entirety.

TECHNICAL FIELD

The disclosure herein relates generally to spin-torque magnetic memory devices and more particularly to circuits and methods for driving word lines in such memory devices.

BACKGROUND

Resistive memory devices store information by controlling the resistance across each memory cell such that a read current through the memory cell in the memory device will result in a voltage drop having a magnitude that is based on the information stored in the memory cell. For example, in certain magnetic memory devices, the voltage drop across a magnetic tunnel junction (MTJ) in each memory cell can be varied based on the relative magnetic states of the magnetoresistive layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing to magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages, where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

In an array of magnetoresistive memory cells, each memory cell is often coupled to a corresponding selection transistor that allows each memory cell to be individually selected for access. The selection transistor for each memory cell is coupled in series with the memory cell between a source line and a bit line. A word line is coupled to the gate of the selection transistor, thereby controlling current flow through the series circuit based on the voltages applied to the source and bit lines. In some instances, a higher word line voltage is needed in order to enable an appropriate amount of current flow through the memory cell that is sufficient to cause the free portion within the memory cell to change its magnetic orientation.

Because a magnetic random access memory ("MRAM") may include thousands or millions of memory cells, reducing the amount of area needed for each memory cell and the associated access circuitry for the memory cell can provide for increased memory cell density. Higher memory cell density allows for greater data storage capacity in the MRAM. One technique that has been applied to reduce the area required for the associated access circuitry for the memory cells is to use local source lines. Such local source lines allow the memory cells to be packed more densely, but can result in additional power consumption. Therefore, it is desirable to provide techniques for supporting such local source lines that alleviate some of the disadvantages associated with additional power consumption while promoting proper memory operation.

DETAILED DESCRIPTION

Figure 1:
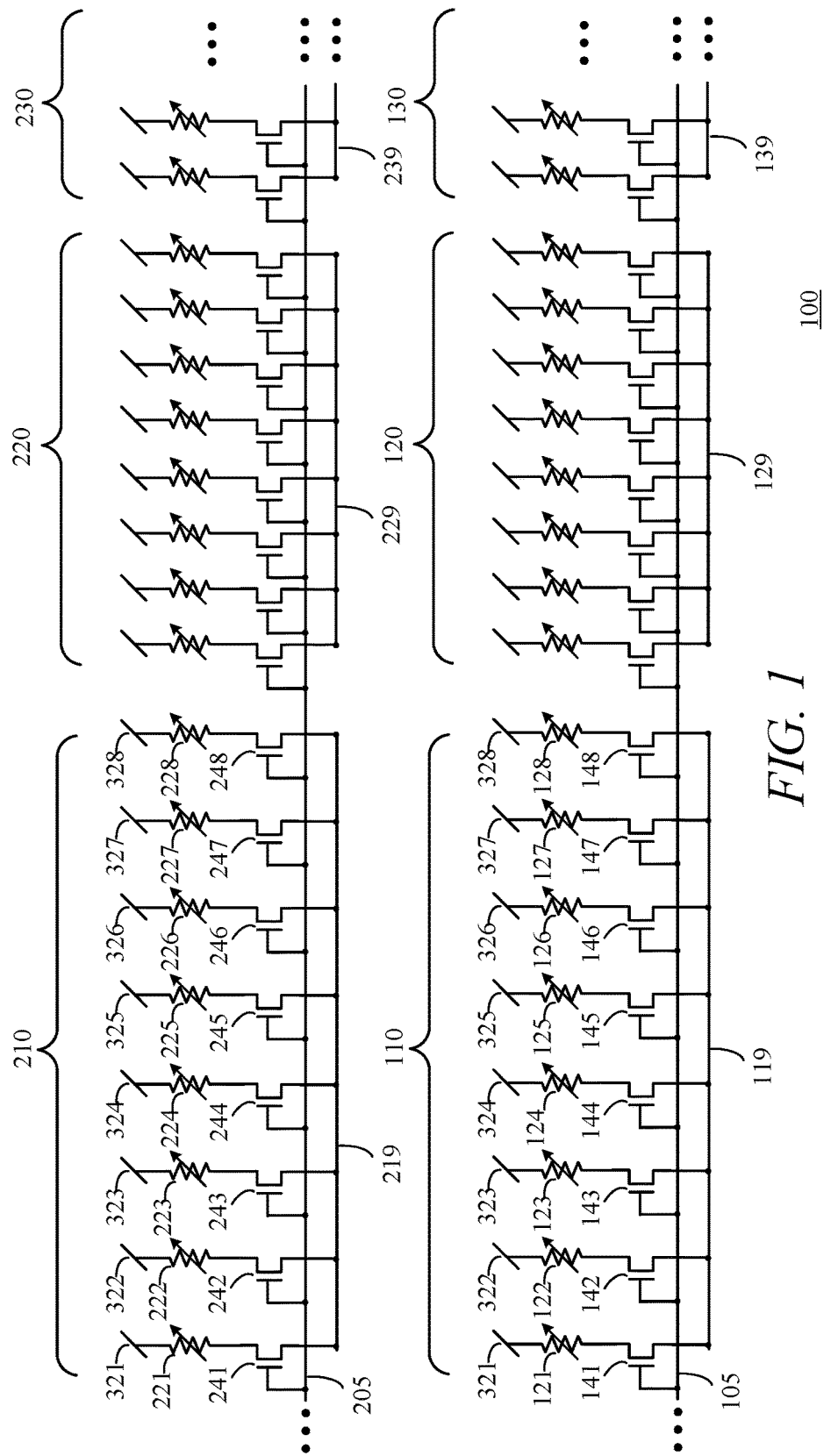
FIG. 1 is a schematic diagram of a portion of a magnetic memory device array in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to assist improve understanding of the example embodiments.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard MRAM process techniques, generation of bias voltages, fundamental principles of magnetism, and basic operational principles of memory devices.

During the course of this description, like numbers may be used to identify like elements according to the different figures that illustrate the various exemplary embodiments.

For the sake of brevity, conventional techniques related to reading and writing memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Nonvolatile memory devices are often used in various applications in order to store data that remains valid after power is no longer applied. Examples of such nonvolatile memory devices include resistive memory devices such as MRAMs in which the resistance experienced by current flowing through the memory cell varies based on the orientation of magnetic vectors within the memory cell and where such resistance variations are used to store data. As noted above, spin torque memory devices send a current through the magnetoresistive stack in order to store information in a memory cell. Depending on the direction of the current, and assuming it has adequate magnitude, the free portion of the memory cell will be forced into a corresponding magnetic state indicative of the information to be stored in the cell. As discussed above, the various sensing and writing operations in memory devices can require currents of different magnitudes and directions to flow through the memory cells.

In order to increase density in magnetic memories that include spin torque memory cells, local source lines shared by a predefined set of memory cells can be employed in order to reduce the area needed for the memory array. Such local source lines are described in detail in U.S. Pat. No. 8,355,272, which issued Jan. 15, 2013, and which is assigned to the same assignee as the present application. As described in additional detail below, the use of such local source lines can require increased power consumption as a large number of bit lines associated with the memory array are forced to a certain voltage during each operation. As described herein, such additional power consumption can be leveraged to increase or otherwise adjust the voltage of word lines used to drive the selection transistors in the memory array, thereby "auto-booting" the word lines such that they reach a desired voltage level corresponding to writing operations. Thus, such auto-booting techniques enable some of the additional power required for supporting the local source lines to be harnessed and reused in a beneficial manner.

FIG. 1 is a schematic block diagram showing a portion of an example memory device 100 that includes an array of memory cells arranged in rows and columns. In one embodiment, the memory cells are resistive memory elements where information stored in each memory cell is represented by different amounts of resistance perceived by current flowing through the memory cell. Examples of such memory cells include MRAM cells such as spin-torque MRAM cells. In one embodiment, each of the memory cells includes an MTJ where the resistance through the memory cell indicates the information stored in the memory cell. As noted above, such memory devices are well known in the art.

As shown in FIG. 1, the array of memory cells is divided into a number of sets of memory cells, including sets 110, 120, 130, 210, 220, and 230. Each of the sets of memory cells includes a corresponding local source line that is shared by all of the memory cells included in the set. For example, the set of memory cells 110, which includes memory cells 121-128, includes local source line 119 that is shared by all of the memory cells 121-128. Similarly, set 120 includes local source line 129, set 130 includes local source line 139, set 210 includes local source line 219, set 220 includes local source line 229, and set 230 includes local source line 239. Each of the sets of memory cells may also be referred to as a bit-line group. In the embodiment illustrated, the voltage on each of the local source lines can only be influenced or controlled by driving one or more of the bit lines coupled to the source line. The local source lines are not driven directly, but instead act as a coupling node that allows voltages to be applied on the bit lines coupled to each respective local source line to cause current to flow through the memory cells in one direction or the other depending on the voltages applied. In the example illustrated, each local source line is shared by eight memory cells. In other embodiments, 16 memory cells or other numbers of memory cells may be coupled to a local source line in the manner illustrated. Similarly, while a limited number of memory cells are illustrated in the diagram shown in FIG. 1, one of ordinary skill in the art appreciates that a memory array for a magnetic memory device would typically include many thousands or millions of such memory cells.

Within each of the sets of memory cells, a selection transistor is coupled between a first electrode of a corresponding memory cell and the local source line for the set of memory cells. For example, selection transistor 141 is coupled between memory cell 121 and local source line 119. Similarly, each of selection transistors 142-148 is coupled between a corresponding memory cell 122-128 and the same local source line 119. Each of the selection transistors for the set of memory cells is controlled by a word line. In the example of set 110, word line 105 controls each of the selection transistors 141-148. As illustrated, word line 105 also controls the selection transistors corresponding to sets of memory cells 120 and 130 as well as other sets of memory cells not illustrated in FIG. 1. A separate word line 205 controls the selection transistors corresponding to the sets of memory cells 210, 220, and 230.

For each memory cell in the set 110, a corresponding bit line of a plurality of bit lines 321-328 is coupled to a second electrode of the memory cell. For example, a bit line 321 is coupled to the second electrode of memory cell 121. Thus, the memory cell 121 and selection transistor 141 are coupled in series between bit line 321 and local source line 119. In other embodiments, the ordering of the selection transistor and the memory cell may be transposed such that the selection transistor lies between the memory cell and the bit line as opposed to between the memory cell and the source line. As illustrated, each of the bit lines 321-328 is also coupled to the second electrode of a corresponding memory cell within the set of memory cells 210. In general, the bit lines correspond to the columns of the array, and the word lines correspond to the rows of the array. Thus, the selective driving of the bit lines and word lines within the memory array allows for different memory cells to be accessed for reading and writing operations.

Sense amplifiers and write drivers associated with the source lines and bit lines, which are not shown in FIG. 1, enable read and write currents to be passed through selected memory cells to both store information and later retrieve that information. Examples of such sense amplifiers, write drivers, and related circuitry are discussed in U.S. patent application Ser. No. 13/362,599.

When a selected memory cell is to be accessed for a write operation, the bit line associated with the selected memory cell is driven to a high or low voltage, whereas all of the bit lines associated with the other memory cells within the set of memory cells sharing a local source line with the selected memory cell are driven to the opposite low or high voltage. For example, if memory cell 121 is to be accessed for a write operation in which the current flows downward through the memory cell (down-current write), the bit line 321 is driven high, while the bit lines 322-328 are driven low. The word line 105 is asserted such that the selection transistors 141-148 allow current flow through their respective series circuits and an amount of current flows from bit line 321 through memory cell 121 and selection transistor 141 to the shared local source line 119. The current is divided amongst the other seven series circuits sharing the local source line 119 such that one seventh of the current flows through each of selection transistors 142-148 and their corresponding memory cells 122-128. While the current through memory cell 121 may be sufficient to cause the free layer within memory cell 121 to change state, only one-seventh of that current passes through each of memory cells 122-128, and the system is designed such that the fractional current is insufficient to disturb the magnetic state of those memory cells. In the embodiment illustrated, such a write operation in which the current flows first through the selected memory cell and then through the selection transistor for the selected memory cell may be referred to as a down-current write. In contrast to memory devices in which the source line may be driven directly to cause current to flow through an individual memory cell, in an embodiment with local source lines, the bit lines corresponding to memory cells in the set that are not being accessed are driven to cause current to flow through the selected memory cell. Such local source lines allow for simplified layout of the memory cells and corresponding access circuitry as selection and driving elements are not required for the local source lines.

In determining the number of memory cells to be included within each set of memory cells having a shared local sense line, the current flow needed for switching one of the memory cells can be considered to determine a minimum number of additional memory cells to be included in the set such that the divided current flowing through those additional memory cells is insufficient to disturb those cells. Thus, if one-seventh of the current could potentially disturb one of memory cells 122-128, a larger number of memory cells can be included within the set 110 in order to further divide the current through the non-selected memory cells and ensure they are not disturbed.

In the down-current write example given above, bit line 321 being driven high, while bit lines 322-328 are driven low, results in current flowing downward through memory cell 121. When of sufficient magnitude, such downward flowing current will result in the free portion of memory cell 121 being forced to a first state that corresponds to either a binary "1" or "0". In order to force the free portion of the memory cell 121 to a second state which is opposite the first state and therefore stores the other binary value, an upward current of sufficient magnitude through memory cell 121 is needed (up-current write). In order to achieve this, bit line 321 is driven low while each of bit lines 322-328 is driven high. In order for the current to flow, the word line 105 must be driven to a sufficient voltage in order to enable current flow through each of the selection transistors 141-148.

In one embodiment, when the data in one or more memory cells in a row are to be accessed, the data stored in each of the memory cells to be accessed is sensed and stored in local data-store latches. Such an operation is sometimes referred to as an "activate" operation, and the one or more cells whose information is stored in the local data-store latches can be referred to as a "page." In accordance with the disclosure in U.S. patent application Ser. No. 13/362,599, the activate operation can include a self-referenced read operation that determines the information stored in each of the memory cells in the selected page. The self-referenced read operation includes first sampling the resistance of each of the memory cells in the selected page. After sampling the resistance of the memory cells, the memory cells are all written to a first state. For example, all of the memory cells may be written to a logic "0." Following the write to the entire page of memory cells, the resistance of each of the memory cells is sampled again and compared with the previous sample taken from the same memory cell before the write operation. Based on the comparison, the original state of the memory cell (i.e. "1" or "0") can be determined based on whether or not the resistance changed significantly as a result of the writing operation.

Once the activate operation is complete and the information from the selected page is in the local data-store latches, read and write operations can be performed by retrieving data from and storing data into the local data-store latches. Such a self-referenced read ensures that deviations between the resistance values of different memory cells do not impact the ability to sense the information stored therein. When the read and write operations corresponding to the selected row are complete, a "precharge" operation is performed. While read and write operations to the activated row typically occur before precharging, the precharge operation can also be performed immediately after an activate operation. During the precharge operation, the information in the local data-store latches is transferred to the memory cells in the corresponding row within the memory array. Note that because the sensing operation has left all of the selected memory cells in the row in the first state, only those memory cells that need to be changed to the second state are written during the precharge operation. For example, if the sensing operation writes all of the memory cells to a logic "0" (first state), then only those memory cells that are to store a logic "1" (second state) need to be written during the precharge operation. One of ordinary skill in the art appreciates that the first state may correspond to either a logic "1" or "0" such that the second state corresponds to the complementary "0" or "1" logic value.

As noted above, for a spin-torque MRAM, the first state can be stored in the memory cell by sending a write current of sufficient magnitude through the memory cell in a first direction. Storing the second state in the memory cell is accomplished by sending a write current of sufficient magnitude through the memory cell in a second, opposite direction. As such, an activate operation will only require write current in a first direction, and a precharge operation will only require write current in the opposite direction. As such, activate operations can rely on down-current writes, where, in the embodiment of FIG. 1, the majority of the bit lines are driven low, whereas certain select bit lines will be driven high. In such an embodiment, precharge operations can rely on up-current writes. It should be appreciated that the current direction for activate and precharge operations can be transposed in other embodiments.

A word line driver, which is not shown in FIG. 1, drives the word line 105 when the row of memory cells corresponding to word line 105 is selected for reading or writing operations. Selection of the row corresponding to word line 105 is based on address information provided to the memory device that determines which of the rows of memory cells is to be accessed for reading or writing. As discussed in more detail below, decoding circuitry, which decodes the address information to determine which word line is to be driven, is typically shared such that portions of the decoding circuitry may be used by many word line drivers. Minimizing the area required for each of the selection transistors 141-148 results in such devices having smaller widths, which in turn increases the on-resistance of the selection transistors 141-148 when word line 105 is driven. Because having a low on-resistance for the selection transistors 141-148 is desirable for many reasons, higher word line voltages can be used to decrease the on-resistance of the selection transistors 141-148 while still allowing those transistors to have a smaller width.

As illustrated in FIG. 1, the series circuit through which current flows for an up-current write is slightly different from that for a down-current write from the perspective of the current flow. In order to ensure proper operation, this difference may require different word line voltages for up-current and down-current writes in order to enable sufficient current flow during those operations. For example, during an up-current write with respect to memory cell 121 (bit line 321 is low and bit lines 322-328 are high), a higher word line voltage on word line 105 results in greater gate-source voltage (VGs) on selection transistor 141, which in turn results in a lower resistance across the selection transistor 141 in the series connection with memory cell 121. Such higher word line voltages are sometimes greater in magnitude than the logic supply voltage for the memory device.

The present application presents a technique for achieving such a higher word line voltage without undue additional power consumption by utilizing the movement of the large number of bit lines 322-328 from a low to the high voltage, as such movement causes the word line 105 to be boosted to higher voltage level based on the capacitive coupling between the word line 105 and the plurality of bit lines 322-328.

In accordance with one embodiment that employs this "auto-booting" technique, when a write to memory cell 121 is to occur, the word line 105 is driven to an initial first word line voltage. In the case of an up-current write, the first word line voltage is less than the needed word line voltage for the write to occur. In some embodiments, the first word line voltage may be a voltage greater than an available power supply (e.g. VDD), which can be generated using a charge pump or other known techniques for achieving voltages greater than supply voltages. In other embodiments, the first word line voltage may correspond to the voltage needed for a down-current write, a voltage less than a supply voltage, or a voltage equal to a supply voltage. After the word line has been driven to the first word line voltage, the word line is isolated from the circuitry that was used to drive the word line to the first word line voltage. The resulting isolated word line is effectively floating in the sense that it can be influenced by capacitive coupling with other portions of the access circuitry. Following isolation of the word line 105, the plurality of bit lines 322-328 (i.e. those corresponding to the memory cells not being accessed) are driven to a first bit line voltage. The first bit line voltage may be different than the first word line voltage. For example, if the first word line voltage is a voltage greater than a supply voltage, the first bit line voltage may correspond to the supply voltage. In a specific example memory having a supply voltage VDD, the first word line voltage may be slightly greater than VDD while the first bit line voltage may be about equal to VDD (i.e. the bit lines are driven "high"). In some embodiments, these bit lines begin at ground or a very low voltage in order to minimize leakage current. In other embodiments, a small amount of voltage may be on each of those bit lines prior to their being driven high.

Each of the bit lines driven to the first bit line voltage is in a series circuit with a corresponding selection transistor 142-148 that is capacitively coupled to the word line 105. As such, when the bit lines are driven to the first bit line voltage (e.g. "high" or VDD), the voltage on the isolated word line is adjusted based on the increased voltage on the bit lines. For example, when the majority of the bit lines are driven high, the word line voltage will increase by a proportional amount. The resulting second word line voltage on the isolated word line preferably corresponds to the needed word line voltage on selection transistor 141 to support an up-current write to the memory cell 121. Thus, when the high voltage is applied to bit lines 322-328 and a low voltage is applied to bit line 321, the isolated word line holds a sufficient "auto-booted" voltage for the up-current write operation to occur. Because numerous bit lines need to be driven to a higher voltage to support the local source line configuration, utilizing the capacitive coupling of those bit lines to the word line to achieve a higher word line voltage without necessitating a greater drive strength with respect to the word line can be advantageous in reducing power consumption.

In order to determine the initial first word line voltage to which the word line 105 is driven prior to isolation, the amount of charge expected to be provided to the isolated word line based on the number of selection transistors coupled to the word line can be considered. In the example illustrated in FIG. 1, charge will be placed on the isolated word line 105 from however many bit lines are being driven to the higher voltage in each of the sets of cells coupled to the word line 105, including sets 110, 120, and 130. Thus, if the bit lines corresponding to sets of cells 120 and 130 are also driven to the higher bit line voltage to which the bit lines 322-328 are driven, additional charge will be supplied to the isolated word line 105.

In some embodiments, the desired word line voltage may be achieved by driving a greater or fewer number of bit lines that interact with the word line to a higher voltage, thereby resulting in varying amounts of charge being placed on the isolated word line. In other embodiments, the amount of voltage increase on the isolated word line can be controlled by driving unused bit lines, which are capactively coupled to the isolated word line, to varying voltage levels to achieve the desired voltage increase. In yet other embodiments, a supplemental voltage provider can be coupled to the isolated word line, where the supplemental voltage provider provides additional charge or drives a different voltage onto the isolated word line in order to ensure that the needed voltage level is achieved on the word line for the up current write.

Such supplemental voltage providers, which may be referred to as "keeper" structures, are discussed in additional detail below.

Based on the activate operation, which, in one embodiment, utilizes a down-current writes to put all of the memory cells within a page in the same state, being followed by a precharge operation, which relies on up-current writes to write data back to selected memory cells, the majority of the bit lines corresponding to a particular word line will always be moving in the same direction. For example, during a precharge operation, only the bit lines corresponding to selected memory cells to which new data needs to be written will be driven low. As such, all of the remaining bit lines are available to be driven high, thereby providing a boost to the word line voltage.

In an example where one of the memory cells included in the set of memory cells 120 is part of the page being accessed, it may not be necessary to write new data to that memory cell during the precharge operation. In other words, if the data to be stored in the memory cell within set 120 corresponds to the state of the memory cell after the activate operation, that state doesn't need to be modified or overwritten. However, it is still possible to drive all of the bit lines corresponding to the memory cells within set 120 to a higher level in order to help boost the word line 105. Notably, the higher level to which these effectively unused bit lines are driven may be less than that corresponding to the bit lines used to provide voltage for an up-current write. Thus, the other bit lines corresponding to sets of memory cells 120 and 130 could be driven to a different bit line voltage then either the bit line 321 corresponding to the selected memory cell 121 or the plurality of bit cells 322-328. Such a third bit line voltage could be configured to add the needed amount of additional voltage to the word line 105 to reach the desired second word line voltage.

In yet other embodiments, the word line 105 may be segmented into local word lines that access smaller numbers of sets of memory cells such that potential variation in terms of the amount of additional charge provided to the word line during an up-current write is reduced. For example, rather than being coupled to the selection transistors for a large number of sets of memory cells, including sets 110, 120, and 130, word line 105 may be segmented such that those three sets are the only sets controlled by word line 105. It should be appreciated that variations on the number of selection transistors coupled to a particular word line are possible where adjustments to the initial first word line voltage prior to isolation and bit line driving voltages can occur in order to achieve the desired result.

While FIG. 1 illustrates the "auto-booting" of a word line in the context of a memory that includes local source lines, it should be appreciated that once a word line is isolated, the bit lines coupled to the selection transistors controlled by the word line can be used to influence the voltage on the isolated word line in embodiments where shared local source lines are not employed. Thus, while the auto-booting concept may be particularly advantageous in a local source line embodiment where many bit lines are necessarily driven to a higher voltage, it can also be used in embodiments without local source lines.

Figure 2:
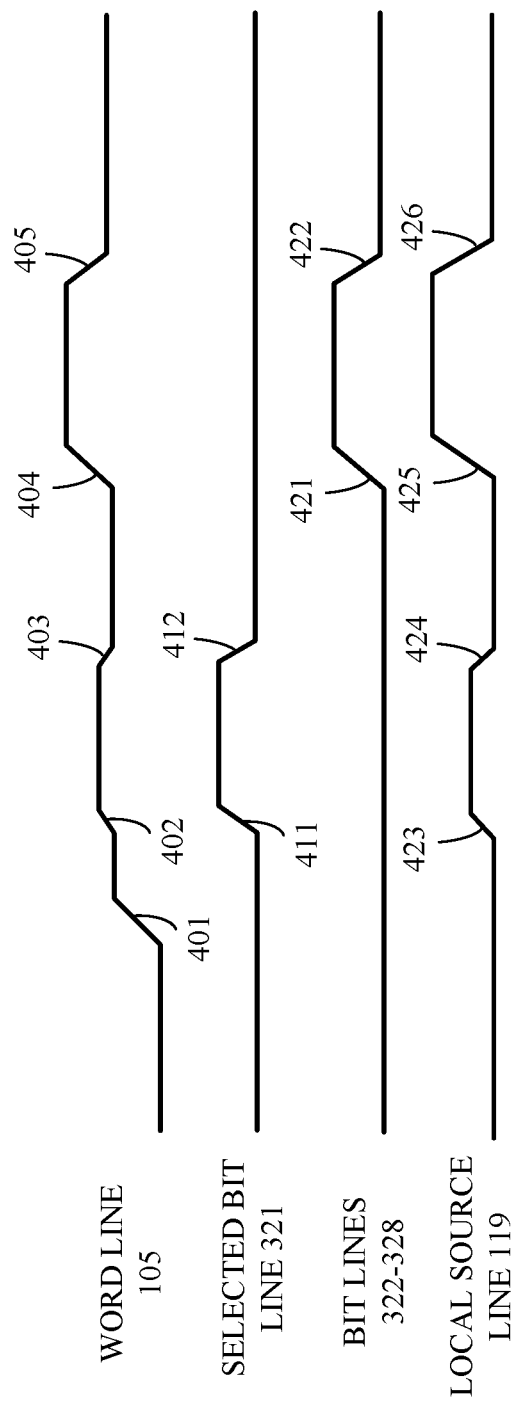
FIG. 2 is a timing diagram associated with certain signals included in the schematic diagram of FIG. 1 in accordance with an exemplary embodiment.

FIG. 2 illustrates a timing diagram corresponding to certain signals of FIG. 1 during both a down-current write and an up-current write corresponding to memory cell 121. As shown, word line 105 is initially driven at 401 to a first word line voltage, which, in some embodiments is greater than a supply voltage such as VDD. In the case where a down-current write is to occur, the word line voltage may not need to be boosted at all in order to provide sufficient voltage on the selection transistor to enable the down-current write to occur. As such, the initial first word line voltage may be at or near the word line voltage necessary for a down-current write. Once the word line 105 is driven to the initial word line voltage at 401, it is isolated such that it is floating and its voltage level is susceptible to movement based on the word line's capacitive coupling to other signal lines.

When the selected bit line 321 is driven high at 411 while the bit lines 322-328 remain low, a small amount of voltage influence from selected bit line 321 to word line 105 may occur such that a slight boost 402 in word line 105 occurs as a result of selected bit line 321 being driven high. As can be seen, the local source line 129 is raised slightly during the down current write (between edges 423 and 424) as current flows through the selected memory cell 121 and a fraction of that current flows through the remaining memory cells 122-128.

When the down-current write is completed and the selected bit line 321 is no longer driven high at 412, the word line 105 returns to the initial first line word line voltage at 403. As noted above, the down-current write may correspond to an activate operation where information corresponding to a page of memory cells is placed in local sense amplifiers for access in reading and writing operations. Following those operations, a precharge operation returns the data in the sense amplifiers to the array of memory cells. As such, sometime following the initial down-current write operation, a subsequent up-current write operation is used to store new values in some or all of the memory cells included in the page. While the down-current write and up-current write are illustrated as being in close temporal proximity in FIG. 2, it should be appreciated that those operations could be separated by a number of read and write accesses to the data-store latches.

When the bit lines 322-328 are driven to a first bit line voltage at 421, marking the beginning of the up-current write, the word line 105 is boosted at 404 to a second word line voltage that is sufficient to support the needed gate voltage at the selection transistor 141 during the up-current write. As noted above, the first bit line voltage may be different than the first word line voltage. For example, the first bit line voltage may correspond to a supply voltage, while the first word line voltage may correspond to a voltage greater than the supply voltage. As can be seen, the local source line 129 is raised to a higher voltage during the up-current write (between edges 425 and 426). When the bit lines 322-328 return low at 422, the capacitive coupling between those bit lines and the word line 105 results in the word line 105 returning to its initial first word line voltage at 405.

Figure 3:
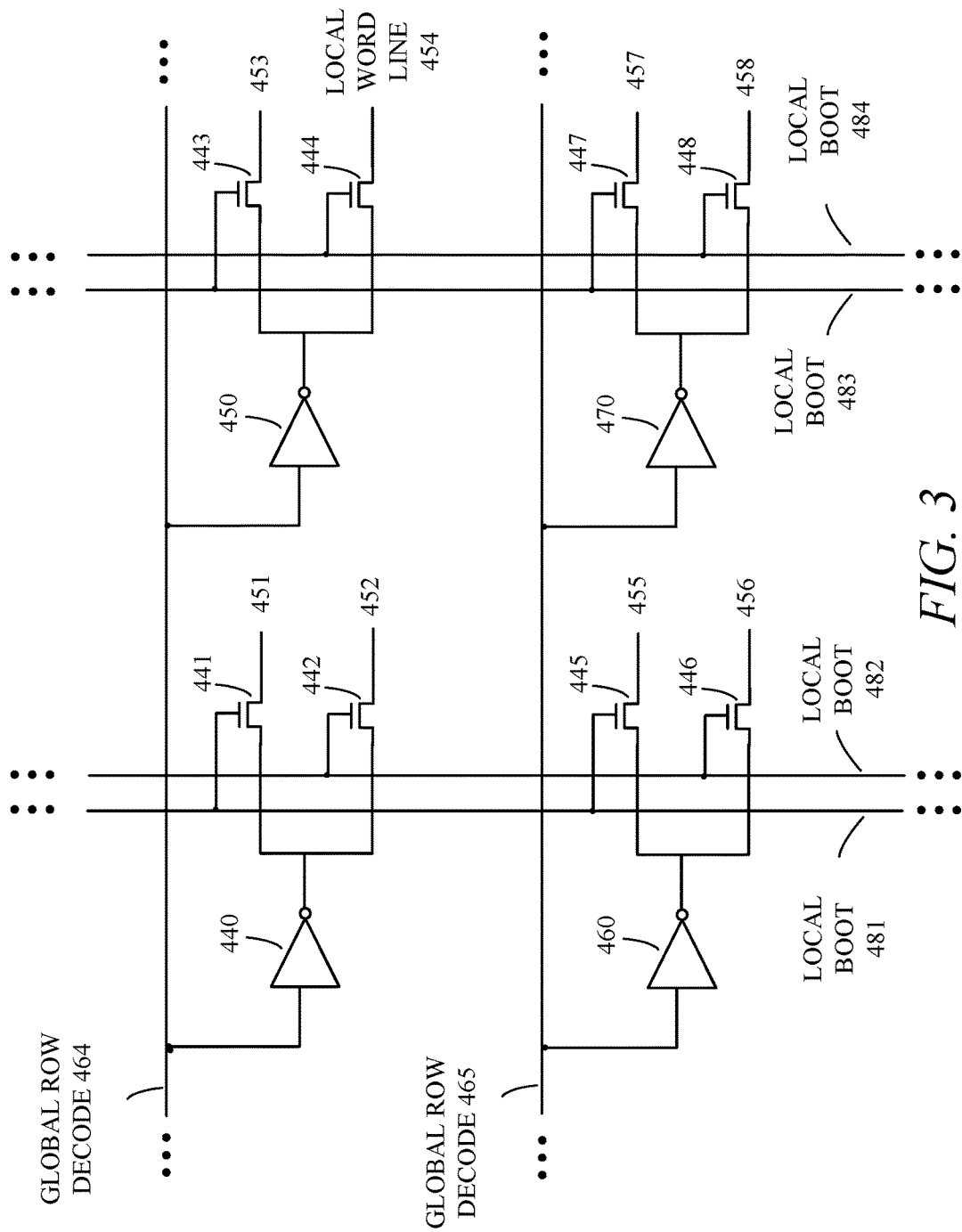
FIG. 3 is a schematic diagram of a portion of a magnetic memory device associated with driving local word lines in accordance with an exemplary embodiment.

FIG. 3 illustrates a schematic diagram of a group of local word line drivers in accordance with an exemplary embodiment that allows the local word lines to be driven as well as isolated for auto-boot operations. As noted above, the word lines for an array of magnetic memory cells may be segmented into shorter sections that include smaller subsets of the total number of memory cells in the array. Having shorter sections allows the transistors used to select the local word lines to be kept small. In the embodiment illustrated in FIG. 3, a plurality of local word lines 451-458 can be selectively driven, isolated, or grounded.

Global row decode signals 464-465 provide a first level of decoding corresponding to whether a received address selects a local word line from a first set of local word lines or a second set of local word lines. The local boot lines 481-484 provide a second level of decoding that allows for selection of one or more particular local word lines in the set of local word lines controlled by each global row decode signal. For example, if global row decode signal 464 is low, and local boot line 484 is high, transistor 444 will cause the inverter 450 to drive the local word line 454 to an initial first word line voltage. Note than the initial first line voltage may be a voltage greater than a supply voltage for the memory. Thus the inverter 450 may be able to output a voltage greater than the supply voltage or a charge pump or other voltage boosting circuit may be supplied in the circuit to enable the first word line voltage to be greater than a supply voltage. In the example where the voltage to be driven onto the local word line 454 corresponds to the supply voltage for the inverter 450, the local boot line 484 is initially driven to a voltage level about equal to the supply voltage for the inverter 450 plus some additional amount greater than the threshold voltage of the transistor 444 such that the full inverter supply voltage is passed to the local word line 454.

Once the first word line voltage has been driven onto local word line 454, the voltage on local boot line 484 can be reduced such that the gate-to-source voltage (VGs) across transistor 444 is about 0 volts, and the local word line 454 is allowed to float. When local word line 454 is so isolated, transistor 444 will not allow current to bleed back from the local word line 454 to the output of the inverter 450. The isolation of local word line 454 allows it to be subsequently booted by the plurality of bit lines driven during an up-current write operation as discussed above.

When local word line 454 is the selected local word line, local boot lines 481-483 are low, thereby isolating local word lines 455-457 by turning off transistors 445-447. When global row decode signal 465 is high, none of the local word lines 455-458 is driven high as the output of each of the inverters 460 and 470 is low. Although local boot line 484 is high (because local word line 454 is the selected local word line), and transistor 448 is on, because inverter 470 is low at its output, local word line 458 will be grounded. Such grounding may be advantageous as it bleeds away any accumulated charge on local word line 458 that may occur based on the bit lines being driven for the writing operation being done with respect to local word line 454.

Thus, as shown in FIG. 3, driving the word line to the first word line voltage prior to isolating the word line can include decoding a first portion of an address to determine first row selection information such as the global row decode signals 464-465 and decoding a second portion of the address to determine second row selection information such as the local boot lines 481-484. Such a combination of global and local row decoding enables word lines to be segmented into shorter local word lines and also allows for smaller transistors to be used to enable the local word lines to be driven to the initial first word line voltage.

The embodiment illustrated in FIG. 3 results in many of the unselected local word lines being isolated or "floated" (not driven high or grounded low). While this may be advantageous when floating the word lines is desired to reduce gate leakage current, it can be detrimental to the desired charge sharing that results in auto booting of the selected local word line. For example, all of the local word lines 451-453 and 455-457 associated with local boot lines 481-483 are effectively floating when those local boot lines are low. In order to avoid having so many floating local word lines, additional circuitry can be added to ground the unused word lines rather than allowing them to float. An example of such an embodiment is illustrated in FIG. 4.

Figure 4:
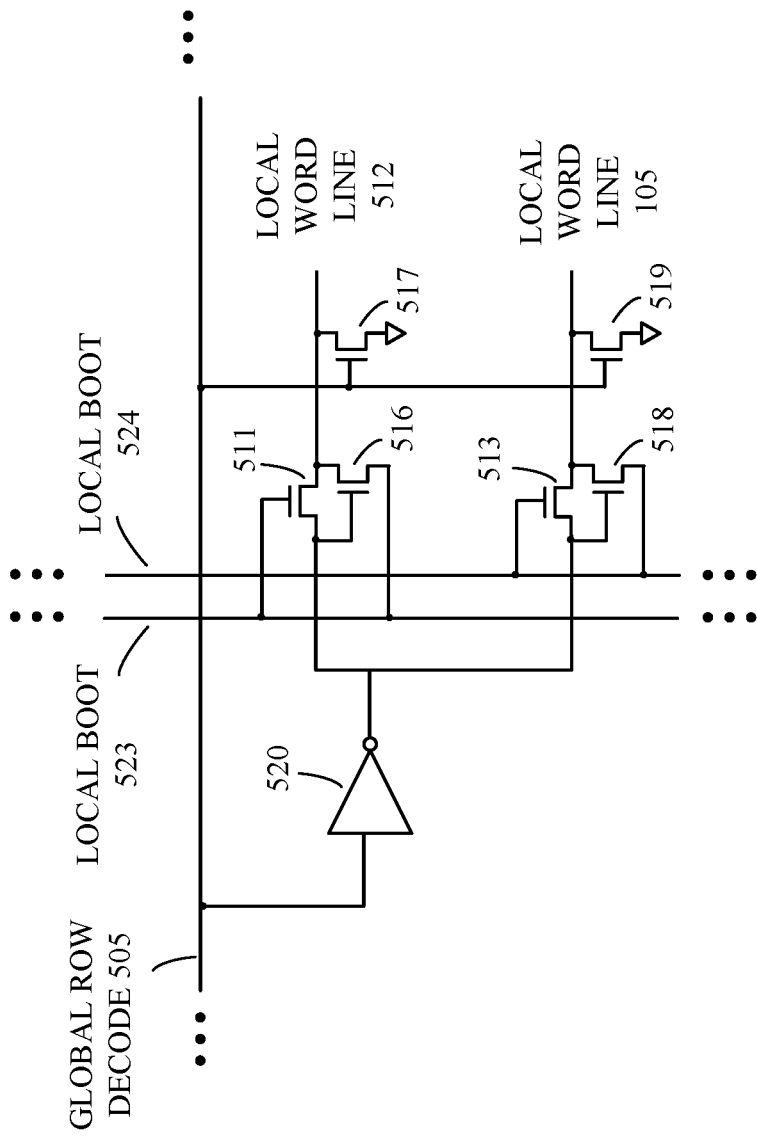
FIG. 4 is a schematic diagram of a portion of a magnetic memory device associated with driving local word lines in accordance with another exemplary embodiment.

In FIG. 4, each local word line 512 and 105 is controlled by three transistors that allow the local word line to be driven by the inverter 520, be isolated, or be pulled to ground. In the configuration illustrated in FIG. 4, when a local word line is not the selected local word line, it is pulled to ground. For example, if the global row decode signal 505 is high, which corresponds to neither of local word lines 512 and 105 being selected, transistors 517 and 519 pull local word lines 512 and 105 to ground.

When global row decode signal 505 is low, the local boot lines 523 and 524 determine whether each of the local word lines 512 and 105 is driven or pulled low. In the case where the global row decode signal 505 is low and the local boot line 523 is low, local word line 512 is not the selected local word line. Because local boot line 523 is low, transistor 511 does not allow the high output of the inverter 520 to be passed through to local word line 512. Transistor 516, which is turned on based on the output of the inverter 520 being high, gates the local word line 512 to the local boot line 523 (which is low), thereby pulling the local word line 512 to ground.

If local word line 105 is the selected local word line, the local boot line 524 is initially driven to a voltage greater than the supply voltage of the inverter 520 such that the threshold voltage of the transistor 513 does not interfere with passing the supply voltage of the inverter 520 to the local word line 105 in its entirety. When it is time to isolate the local word line 105, the local boot line 524 is dropped to a level about equal to the supply voltage of the inverter 520 such that the gate to source voltage (VGs) across transistors 513 and 518 is approximately zero, thereby isolating the word line 105 and preventing bleed back of any charge as those transistors behave as reverse-biased diodes. Thus, the embodiment of FIG. 4 allows non-selected local word lines to be grounded as opposed to leaving them in an isolated state.

In many memory devices, the total set of memory cells can be separated into multiple banks of memory cells that can be accessed independently. In such memory devices, accesses to data in different banks can be interleaved in order to achieve higher bandwidth. For example, an activate operation may be initiated in one bank while data is being read out from another bank in which a page has already been opened. In such memory devices, it is helpful to share global row decoders between banks in order to conserve die area. When global row decoders are shared, individual banks can sample the result of a global decoding operation when the particular bank is the selected bank. Once the selected bank has sampled the result of the global decoding operation, the global row decoder can be used in conjunction with an operation to a different bank.

Figure 5:
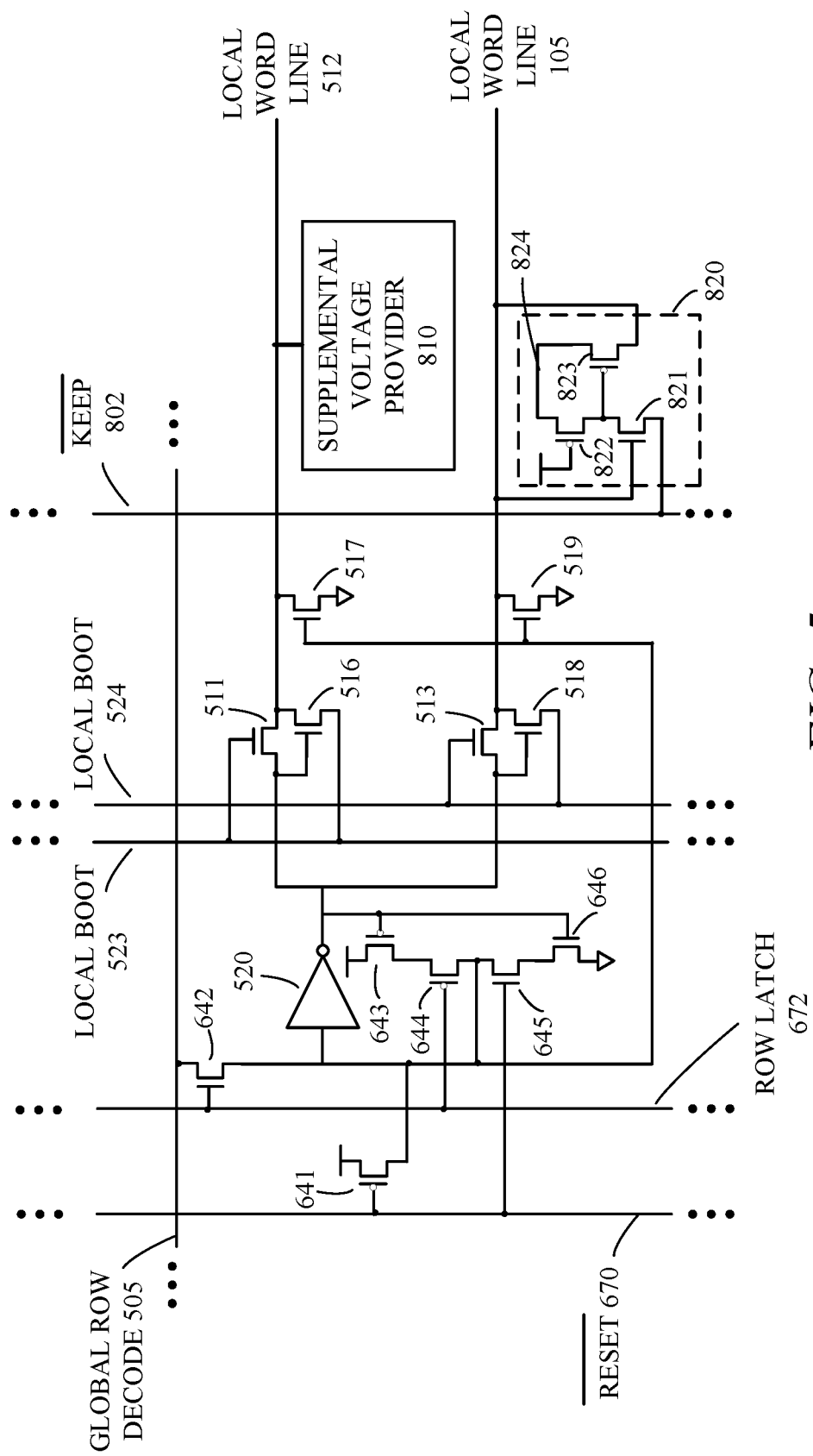
FIG. 5 is a schematic diagram of a portion of a magnetic memory device associated with driving local word lines in accordance with yet another exemplary embodiment.

FIG. 5 illustrates an example embodiment of circuitry that supports such a sampling operation corresponding to a global row decode signal 505. The added circuitry corresponding to the global row decode sampling includes transistors 641-646. Initially, the reset\ signal 670 is asserted low, thereby turning on transistor 641, which forces the output of inverter 520 low and turns on transistors 517 and 519 such that local word lines 512 and 105 are pulled to ground.

After the reset\ signal 670 is de-asserted high, the row latch signal 672 can be used to capture the state of the global row decode signal 505 at a particular point in time. The row latch signal 672 is asserted when the bank that includes the local word lines 512 and 105 is selected. The appropriate latch signal corresponding to the selected bank is asserted based on decoding of bank-select information, which is typically part of the address provided with an operation, including an activate operation.

In an example where one of the local word lines 512 and 105 is to be selected, the global row decode signal 505 goes low for a period of time, and the row latch signal 672 is asserted high for a time based on a determination that the bank is the selected bank. When the row latch signal 672 goes high, the global row decode signal 505 is passed through transistor 642 to the input of the inverter 520. If the global row decode signal 505 is low, the output of the inverter 520 is high, thereby turning on transistor 646, which, in conjunction with transistor 645 (turned on based on reset\ 670 being de-asserted), continues to pull the input of the inverter 520 to ground after the row latch signal 672 is de-asserted. As such, if the global row decode signal 505 is low when the row latch signal 672 goes high, feedback from the output of the inverter captures that low value such that it is held even after row latch signal 672 returns low, thereby isolating the global row decode signal 505 from the input of the inverter 520. Similarly, if the global row decode signal 505 is high, the output of the inverter 520 is low, and transistors 643 and 644 hold the input to the inverter 520 high after the row latch signal 672 was de-asserted.

Once the global row decode signal is sampled, it can be used in conjunction with the local boot signals 523 and 524 to drive one or more of the local word lines 512 and 105 as discussed above. When the operations are complete, the reset\ line 670 can be asserted low once again, thereby ensuring that both local word lines 512 and 105 are grounded and any accumulated charge on those lines is dissipated. As one of ordinary skill in the art appreciates, there are many circuits and techniques that are well known in the art for sampling a particular signal line and holding that value either for a specified duration or until a subsequent reset signal is received. As such, the specific example embodiment provided herein should not be viewed as limiting in any way.

Because the global row decode signal 505 is sampled for the selected bank, after the sampling occurs, the global row decode signal 505 can be used for other operations in other banks within the memory. In one embodiment, sampling the global row decode signal 505 is associated with an activate operation to the particular bank, where the bank select information that accompanies the activate command results in a row latch signal 672 assertion in the selected bank. In such an embodiment, a reset\ signal 670 assertion can be associated with a precharge operation, thereby indicating that the memory operations associated with the activated page within the selected bank have been completed and causing any selected word lines to be de-selected and pulled to ground.

Thus, when a command corresponding to a particular bank (i.e. an activate command) is received, a portion of the address is used to determine to which bank the command is directed. That portion of the address will determine which of the row latch signals within the memory device is asserted in order to sample the global row decode signals within the memory. Another portion of the address is decoded to determine which of the global row decode signals is asserted. While those global row decode signals are distributed to all banks throughout the memory, only the selected bank whose row latch signal is asserted will capture the global row decode signal that is asserted. As before, additional address information corresponding to the row is used to determine which of the local boot lines are asserted in order to determine the appropriate local word line to drive to the initial word line voltage. After the initial driving, the selected local word line can be isolated such that the auto-booting described above can be used to boost the word line to the needed voltage for up-current writes.

Notably, once the selected word line is isolated and allowed to float such that it can be auto-booted, charge begins to leak away from the isolated word line as a result of gate leakage. As such, it may be preferable to limit the amount of time a word line is isolated and expected to supply sufficient voltage to support write operations. In order to alleviate this concern, a supplemental voltage provider 810, which is illustrated in FIG. 5, may be coupled to the local word line such that the voltage level on the local word line can be maintained or boosted by an additional margin when selected and isolated. Such a supplemental voltage provider may also be referred to as a "keeper" based on its function of keeping the local word line at a desired voltage level. For example, if local word line 512 is selected, once it has been driven to the initial first word line voltage and isolated, the supplemental voltage provider 810 can be used to ensure that the voltage on the local word line 512 reaches or stays at the desired voltage level needed to enable the writing operations.

In some embodiments, the supplemental voltage provider 810 is used in conjunction with the auto-boot feature described above where a plurality of bit lines are used to boost the voltage on the local word line 512 based on their capacitive coupling with the local word line 512. In other embodiments, the supplemental voltage provider 810 may be used separate from and independent of such auto-booting. In the case where the supplemental voltage provider 810 is used in conjunction with the auto-boot feature described above, the supplemental voltage provider 810 may be selectively enabled such that it does not begin providing charge to the local word line 512 until after the charge sharing associated with the plurality of bit lines being driven has been initiated. In other embodiments, the supplemental voltage provider 810 may be enabled at the same time that auto-booting occurs, or may be enabled as soon as the local word line 512 is selected.

In some embodiments, the supplemental voltage provider 810 represents a stored capacitive charge that can be selectively coupled to the local word line 512 to provide supplemental charge to the word line, thereby allowing it to maintain a desired voltage level for a longer period of time. In other embodiments, the supplemental voltage provider 810 may represent a connection to a voltage source that continuously maintains the desired voltage level on the local word line 512. Such a voltage source may include a supply voltage, the capacitive reservoir, a charge pump, or various combinations thereof FIG. 5 also illustrates a schematic diagram of an example embodiment of a supplemental voltage provider 820. Supplemental voltage provider 820 includes transistors 821-823. Node 824, which is coupled to transistors 822 and 823 corresponds to a supply voltage, which preferably has a magnitude corresponding to the desired voltage on the word line during an up-current write operation. Transistor 822 provides a weak reset for the supplemental voltage provider 820. Transistor 822 is an undersized transistor that holds the gate of transistor 823 high when the supplemental voltage provider 820 is not activated, thereby preventing transistor 823 from driving the local word line 105 using the voltage at node 824.

When the supplemental voltage provider 820, or "keeper," is to be activated, the keep\ signal 802 is asserted low. Because the local word line 105 is high, transistor 821 overpowers undersized transistor 822 and, when the keep\ signal 802 is low, pulls the gate of transistor 823 low. When the transistor 823 is turned on, the local word line 105 is driven using the voltage at node 824, which preferably corresponds to the desired word line voltage that is to be maintained on the local word line 105. In one embodiment, the keep\ signal 802 is asserted low after the auto-booting corresponding to an up-current write and then later de-asserted high prior to dropping the bit line voltages at the end of the up-current write. Notably, if the initial charge sharing associated with an auto-boot is sufficient to bring the local word line 105 to the desired word line voltage for an up-current write, it may not be necessary to initially assert the keep\ signal 802 low. Instead, that signal can be held high until the voltage on the local word line begins to degrade based on leakage, at which point the keep\ signal 802 can be asserted low to maintain the local word line at the desired voltage.

Figure 6:
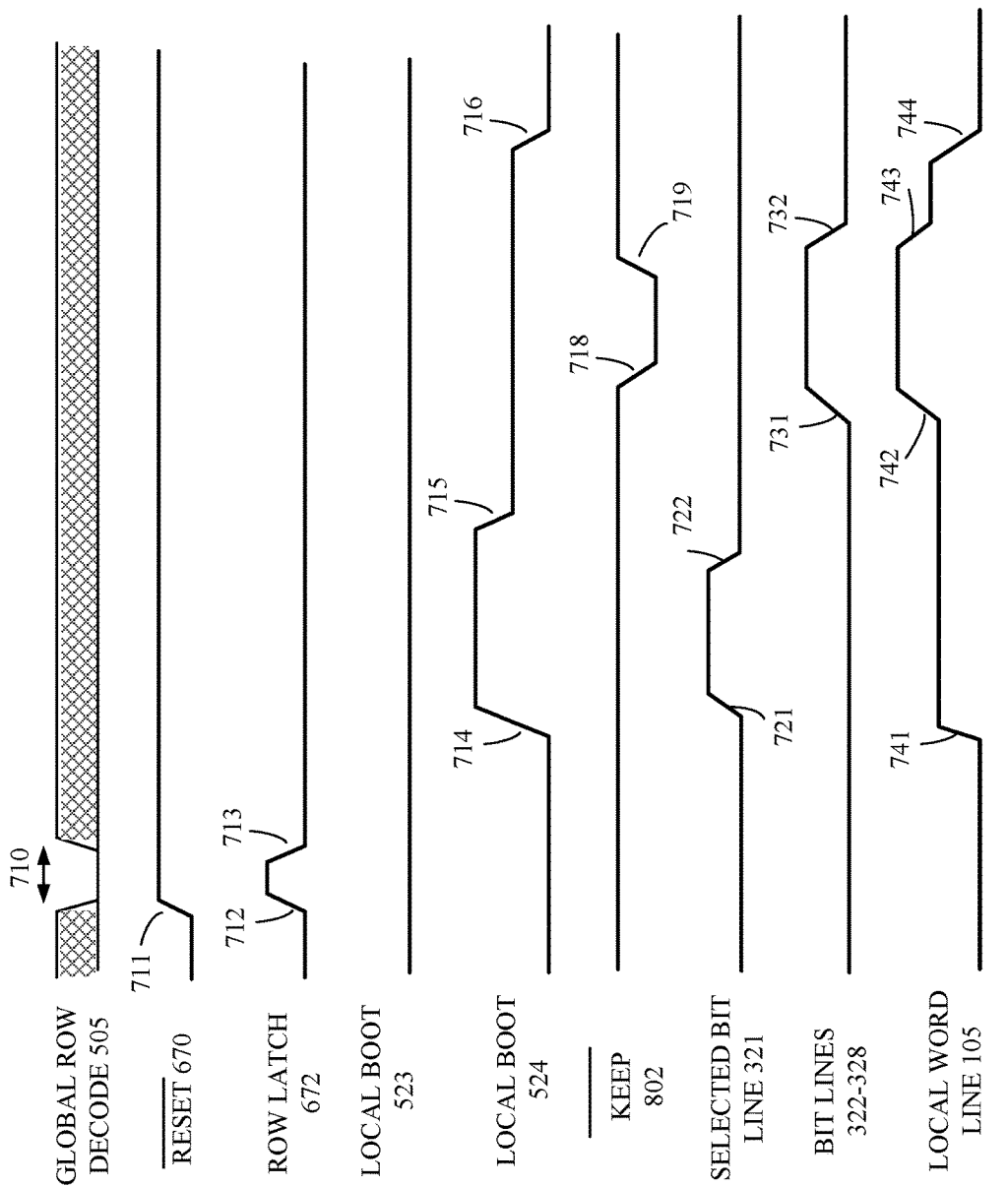
FIG. 6 is a timing diagram associated with certain signals included in the schematic diagram of FIG. 5 in accordance with an exemplary embodiment.

FIG. 6 provides a timing diagram corresponding to certain signals included in FIG. 5. As shown, reset\ signal 670 is de-asserted at 711, thereby allowing the state of the global row decode signal 505 to be sampled. Row latch signal 672 goes high at 712, thereby enabling the state of global row decode signal 505 to be passed to the input of the inverter 520. As discussed above, once the state of the global row decode signal 505 is presented to the input of the inverter 520, a feedback path ensures that the state sampled is maintained following de-assertion of the row latch signal 672 at 713. Thus, because global row decode signal 505 is low during time period 710, and the row latch signal 672 goes high during that time period and returns low before that time period concludes, the circuit of FIG. 5 samples the global row decode signal 505.

After the global row decode signal 505 is sampled, local boot lines 523 and 524 are used to determine which of local word lines 512 and 105 is to be selected. As shown in FIG. 6, local boot line 524 is initially raised to a higher voltage at 714, where the higher voltage is preferably such that the transistor 513 is able to pass the full supply voltage of the inverter 520 to the local word line 105. Driving the local word line 105 to this initial first word line voltage is illustrated as edge 741 in FIG. 6. As discussed above, the initial word line voltage may be sufficient to support a down-current write, and such a down-current write is accomplished by driving the selected bit line 321 high (between edges 721 and 722) while bit lines 322-328 are maintained low. During this time period, a slight boost to the word line voltage on local word line 105 may occur, but because only a small fraction of the bit lines are driven high (bit line 321 and any others corresponding to memory cells in the page being activated), that boost is assumed to be minimal and not illustrated in the timing diagram.

For an up-current write, the voltage on the local boot line 524, which is initially at a higher voltage to pass the full supply voltage for the inverter to the local word line 105, is reduced at 715 to a level that isolates the local word line 105. Once the local word line 105 is isolated, the bit lines 322-328 are driven high at 731. Auto-booting occurs due to capacitive coupling, and the local word line 105 is boosted at 742 to the level needed to support an up-current write. In the example illustrated in FIG. 6, it is assumed that the auto booting initially drives the local word line 105 to the level needed to support the up-current write. Because of this assumption a supplemental voltage provider need not be enabled initially. However, once the charge on the local word line 105 begins to bleed away due to leakage, keep\ signal 802 is asserted low at 718, thereby enabling a supplemental voltage provider to maintain the voltage level on the local word line 105 at the level needed to facilitate the up-current write. The keep\ signal 802 is de-asserted at 719 prior to the bit lines being driven low at 732 such that when the bit lines 322-328 are driven low, the local word line 105 returns to its initial first word line voltage at 743.

When operations corresponding to the local word line 105 are complete, the local boot line 524 is driven low at 716, thereby grounding the local word line 105 at 744 and ensuring that any accumulated charge on the local word line 105 is dissipated. While not shown in FIG. 6, once operations are complete, the reset\ signal 670 may once again be asserted low, thereby readying the circuit for subsequent sampling of the global row decode signal 505 the next time the bank is activated.

Figure 7:
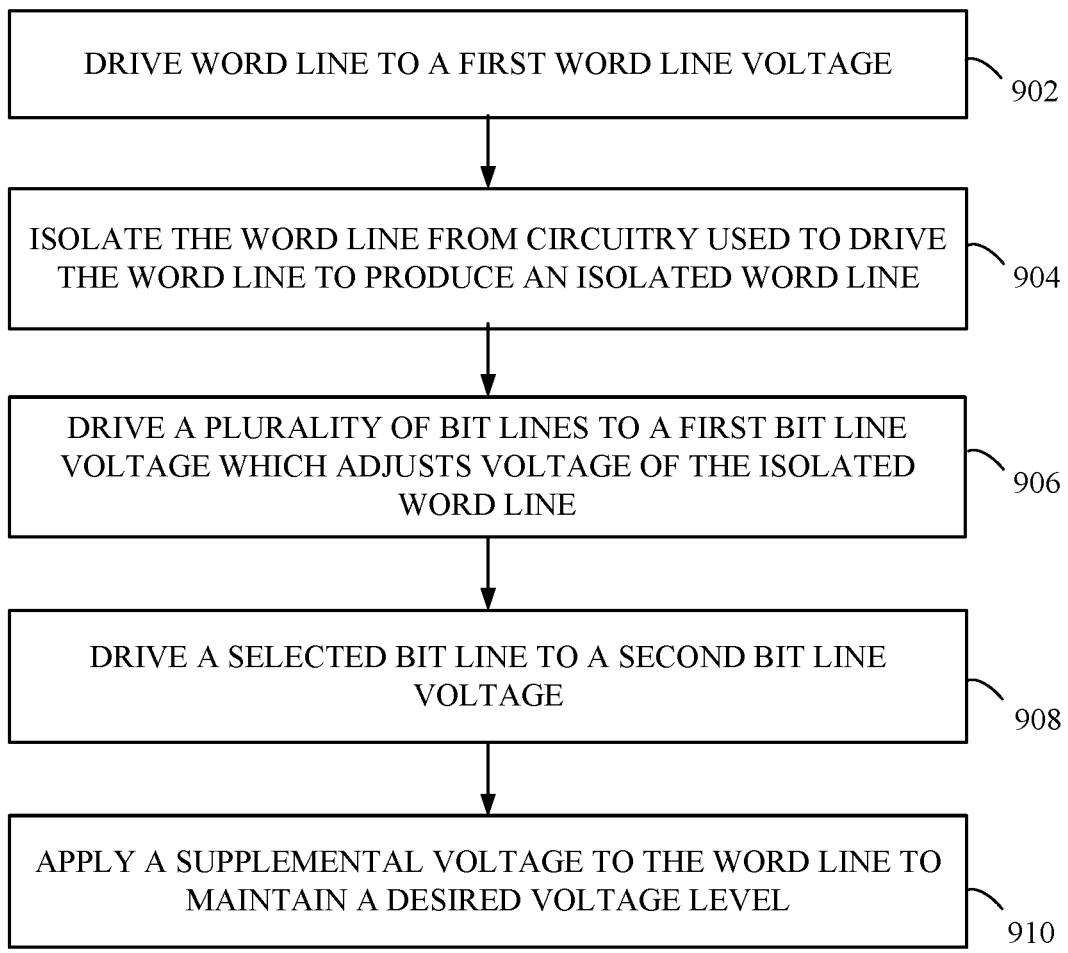
FIG. 7 is a flow chart of a method for accessing a memory cell in a magnetic memory in accordance with an exemplary embodiment.
Figure 8:
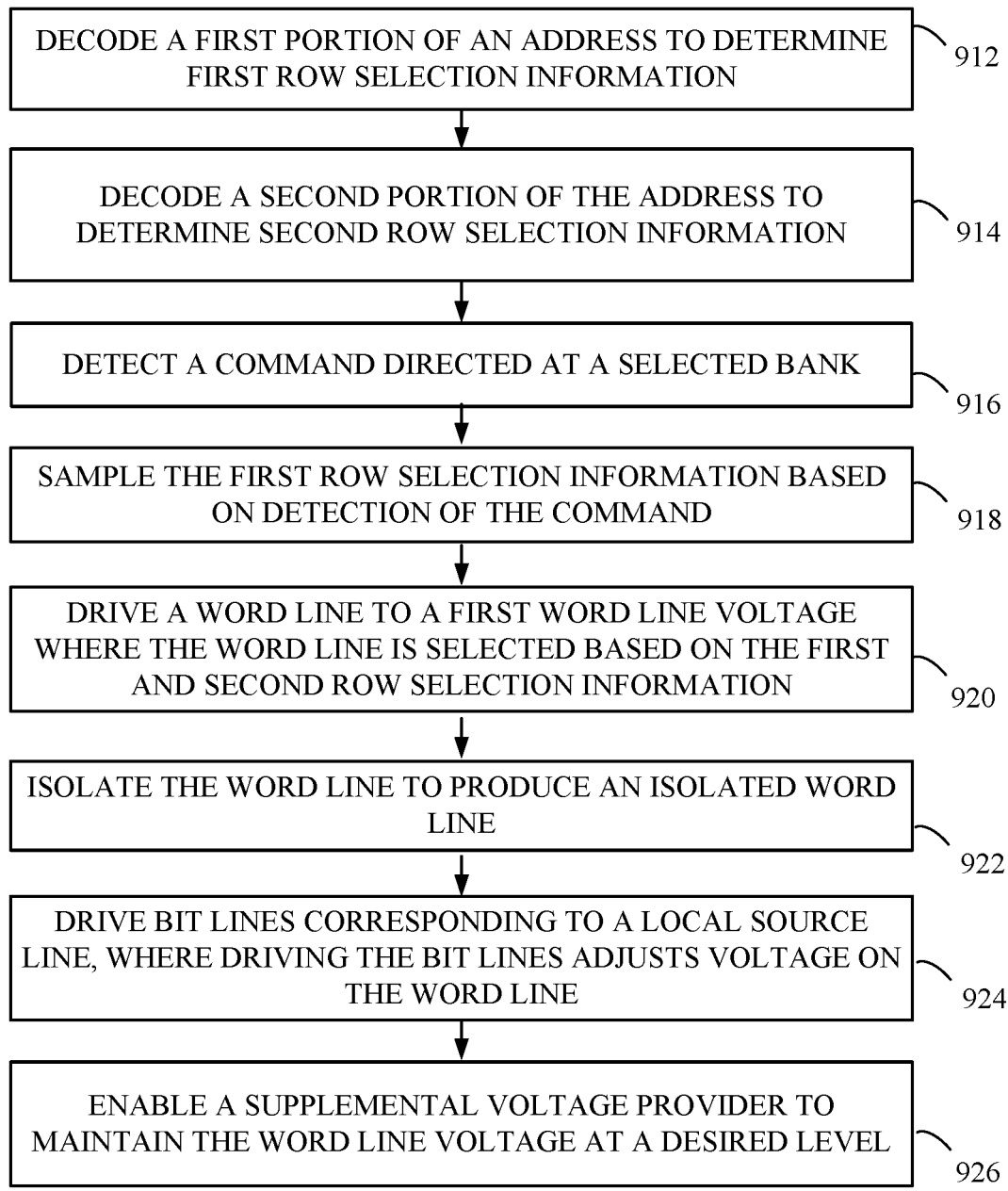
FIG. 8 is a flow chart of a method for accessing a memory cell in a magnetic memory in accordance with another exemplary embodiment.

FIGS. 7 and 8 are flow charts that illustrate exemplary embodiments of a method of accessing a memory cell in a magnetic memory, where, in one example, the magnetic memory includes an array of spin-torque MTJ memory cells. The operations included in the flow charts may represent only a portion of the overall process used to operating the device. For illustrative purposes, the following description of the methods in FIGS. 7 and 8 may refer to elements mentioned above in connection with FIGS. 1-6. It should be appreciated that methods may include any number of additional or alternative tasks, the tasks shown in FIGS. 7 and 8 need not be performed in the illustrated order, and the methods may be incorporated into a more comprehensive procedure or process having additional functionality not described in detail herein. Moreover, one or more of the tasks shown in FIGS. 7 and 8 could be omitted from an embodiment as long as the intended overall functionality remains intact FIG. 7 illustrates a flow chart of a accessing a selected memory cell in a magnetic memory. At 902, a word line is driven to a first word line voltage. As discussed above, the first word line voltage may correspond to the voltage needed to support a down-current write, a supply voltage level, or a voltage greater than the supply voltage level. As also discussed above, which word line is driven to the first word line voltage can be determined by decoding portions of an address received in order to determine which word line is to be driven.

For example, a first portion of an address can be decoded to determine first row selection information. In the examples discussed above, the first row selection information may correspond to the global row decode signals. A second portion of the address can be decoded to determine second row selection information. In the examples above, the second row selection information may correspond to the information used to determine which of the local boot lines are asserted. In such embodiments, driving the word line to the first word line voltage includes selecting the word line to be driven based on the first and second row selection information.

In yet other embodiments, a command corresponding to a bank in a magnetic memory may be detected, where the bank includes the set of memory cells that includes the selected memory cell. For example, an activate command can be received that includes bank selection information. As discussed above with respect to FIGS. 5 and 6, such bank selection information can be used to sample a portion of the row selection information, thereby freeing up the decoders that produce that row selection information for other accesses to other banks in the memory. For example, based on the detection of an activate command to a particular bank, the global row decode signals, which may signals provided to all banks in the memory device, may be sampled by the particular bank to which the activate command is directed. Once that information is sampled, the global row decoders can be used to decode additional addresses for memory cells in other banks. While the example of an activate command has been presented herein, other commands that are directed to specific banks may also rely on similar sampling operations to facilitate pipelining within the memory device.

In addition to using the address information to drive a selected word line to the first word line voltage, that information can also be used to deselect at least one additional word line, where deselecting may include pulling the at least one additional word line to ground. As was the case in some of the examples above, such de-selection was controlled by the local boot lines. Thus, in addition to causing a selected word line to be driven to the first word line voltage, the address information may also cause the remaining word lines to be de-selected, or pulled to ground, in order to ensure that any accumulated charge on those bit lines is removed.

As discussed above with respect to FIG. 1, the selected word line that is driven is coupled to a set of selection transistors, where each selection transistor of the set of selection transistors is coupled between the first electrode of a corresponding memory cell of the set of memory cells and a source line shared by the set of memory cells. The selected memory cell to be accessed using the word line is included in the set of memory cells. In some embodiments, the word line voltage is initially at ground, whereas in other embodiments, the initial word line voltage is slightly above ground, and may correspond to an initial voltage provided on the bit lines used to drive current through the memory cells. The initial voltage provided on the bit lines may be a voltage level required for reliable gate to source voltage of the word line select transistors in the unselected bit lines during a write operation.

At 904, the word line is isolated from the circuitry used to drive the word line to the first word line voltage. Isolating the word line may be accomplished by a variety of means, including reducing the gate voltage on a transistor gating a voltage to the word line such that the transistor behaves as a reverse-biased diode.

At 906, a plurality of bit lines are driven to a first bit line voltage. Each bit line of the plurality of bit lines that is driven to the first bit line voltage is coupled to a second electrode of a corresponding memory cell of the set of memory cells. In the example of an embodiment using local source lines, the plurality of bit lines correspond to those memory cells that are not being accessed, but will source or sink a fraction of the current that is used to write to the selected memory cell. The first bit line voltage is different than the first word line voltage, and driving the plurality of bit lines to the first bit line voltage adjusts the voltage on the isolated word line to a second word line voltage. As discussed above, driving the plurality of bit lines to the first bit line voltage can provide an auto-boot feature with respect to the word line, where, in some embodiments, the word line voltage is boosted up to a level needed to enable an up-current write. Notably, in other embodiments, the capacitive coupling between the plurality of bit lines and the word line can be used to adjust the voltage on word line by different amounts and in different directions. Thus, the capacitive coupling between the plurality of bit lines and the word line can be used to either raise or lower the voltage on the word line as needed.

At 908, a selected bit line is driven to a second bit line voltage. The selected bit line is coupled to a second electrode of the selected memory cell, and driving the selected bit line to the second bit line voltage results in a first current through the selected memory cell. In an embodiment where the selected memory cell and the additional memory cells included in the set of memory cells are all coupled to a local source line, a fractional portion of the first current flows through each memory cell coupled to a corresponding bit line of the plurality of bit lines driven to the first bit line voltage. Thus, as discussed above with FIG. 1, when the selected bit line is driven in one direction, and each of the plurality of bit lines corresponding to the other memory cells in the set is driven in the opposite direction, a circuit is formed between the selected bit line and the plurality of bit lines, where all of the current flows through the selected memory cell, but only a fraction of the current flows through the other memory cells. As also discussed above, the fractional portion of the current is preferably such that it does not disturb the unselected memory cells, whereas the current in its entirety is sufficient to cause the free portion of the selected memory cell to change its magnetic orientation.

In some embodiments, the word line driven at 902 also corresponds to further memory cells in a row, where additional sets of memory cells in the row provide further bit lines that can be driven to specific voltages in order to influence the voltage level on the selected word line. For example, as discussed above with respect to FIG. 1, the bit lines corresponding to the sets of memory cells 120 and 130 can be driven to the first bit line voltage at the same time as the plurality of bit lines 122-128 in order to further influence the voltage on the isolated word line 105. As also discussed above, those additional bit lines included in sets 120 and 130 could be driven to a third bit line voltage that is different than the first and second bit line voltages applied to bit line 321 and bit lines 322-328, respectively.

At 910, a supplemental voltage is applied to the word line to maintain the desired voltage level on the word line. As discussed above, charge may begin to bleed off of the isolated word line, thereby limiting the amount of time the word line is at a voltage level effective for performing write operations within the memory device. In order to extend the length of time the word line can effectively be used to perform write operations, a supplemental voltage can be applied to the word line. As discussed above with respect to FIG. 5, the supplemental voltage may be applied using a supplemental voltage provider that is about equal to the second word line voltage, which, in some embodiments is the word line voltage needed to perform an up-current write. In such a case, the supplemental voltage may be in the form of a voltage supply that holds the word line at the second word line voltage until up-current write operations are nearly complete. In other embodiments, the supplemental voltage is different in magnitude than the second word line voltage such that the supplemental voltage applied is able to either raise or lower the voltage level on the isolated word line. For example, if the auto-boot resulting from driving the plurality of bit lines raises the voltage level on the word line above a desired voltage level, the supplemental voltage applied may lower the word line voltage as opposed to raising it.

As discussed above, accessing a selected memory cell in a magnetic memory can include performing an activate operation that loads the data corresponding to a plurality of memory cells into data storage latches that can be accessed for read and write operations. When using a self-referenced read such as that described above, the activate operation only relies on write current in a single (i.e. up or down) direction. Following the accesses to the page of memory in the data storage latches, a precharge operation writes data to any memory cells included in the page that do not accurately represent the data in the data storage latches when the precharge operation is performed. Those writing operations to the selected memory cells only rely on a write current in the opposite direction used during the activate operation. For example, if the activate operation relies on down-current writes, the precharge operation relies on up-current writes. As such, when local source lines are employed, and a large number of bit lines are necessarily moved during up-current writes or down-current writes, the capacitive coupling between those bit lines and the word line can be leveraged to adjust the word line to a desired voltage needed for writing, thereby reusing some of the power consumed by driving those bit lines.

FIG. 8 illustrates a flow chart of another method for accessing a selected memory cell in a magnetic memory. At 912, the first portion of an address is decoded to determine first row selection information. At 914, a second portion of the address is decoded to determine second row selection information. At 916, a command directed at a selected bank is detected, which results in the first row selection information being sampled at 918. In one embodiment, the actions performed at 912-918 correspond to actions described in the discussion of FIG. 5 above: decoding the global row decode signal, determining which local boot lines to assert, determining that a row latch signal for the bank should be asserted, and latching the global row decode signals for that bank at the appropriate time.

At 920, a word line is driven to a first word line voltage, where the word line is selected based on at least the first and second row selection information. As discussed above with respect to FIG. 1, the word line is coupled to a set of selection transistors, where each selection transistor of the set of selection transistors is coupled between the first electrode of a corresponding memory cell of a set of memory cells and a source line shared by the set of memory cells. In some embodiments, the source line is a local source line, whereas in other embodiments, it is a conventional source line associated with an entire row.

At 922, the word line is isolated to produce an isolated word line. Isolating the word line can include preventing the circuitry used to drive the word line to the first word line voltage from further influence on the word line. In addition, isolating the word line preferably prevents bleed back of charge from the isolated word line to the circuitry used to initially drive the word line or other circuitry used in biasing the isolated word line.

At 924, bit lines are driven in order to perform a write operation to the selected memory cell. Driving bit lines at 924 may include, in the case of a local source line, driving a plurality of bits to a first bit line voltage, while driving a selected bit line to a second bit line voltage. The first bit line voltage may be different than the first word line voltage. In an example corresponding to the array portion illustrated in FIG. 1, driving the bit lines at 924 may include driving bit line 321 to a low voltage, while driving the plurality of bit lines 322-328 to a high voltage. Driving the bit lines at 924 adjusts the voltage on the isolated word line based on capacitive coupling between the bit lines and the word line. In the case where a large number of bit lines are driven to a high voltage, the resulting voltage on the isolated word line may be raised to a level sufficient to facilitate up-current write operations to the selected memory cell (e.g. memory cell 121).

At 926, a supplemental voltage provider is enabled to maintain the word line voltage at the desired level. As discussed above, in some embodiments a supplemental voltage provider may be enabled to adjust the voltage level on the isolated word line to the desired second word line voltage independent from any auto-booting that may or may not occur based on the bit lines being driven. In other embodiments, the supplemental voltage provider is enabled in addition to the auto-booting in order to either further raise or lower the voltage level on the isolated word line to reach a target voltage level, or to maintain a desired voltage level already achieved through the auto-booting. As noted above, the supplemental voltage provider may include a voltage supply, a capacitive load, a charge pump, or various combinations of such elements.

By utilizing auto booting and supplemental voltage providers to achieve a desired voltage on an isolated word line, writing operations to memory cells within the magnetic memory are supported. In the case of auto-booting in a local word line embodiment, driving one bit line within a set of bit lines to a low or high voltage while driving the remaining bit lines in the set of bit lines to the opposite low or high voltage results in current flowing through a selected memory cell sufficient to alter the magnetic state of that memory cell, while only passing a fraction of that current through the remaining memory cells in the set, where the fraction is insufficient to disturb those remaining memory cells. Using the charge required to drive the bit lines to auto boot the word line helps to ensure that unneeded additional power consumption does not occur.

While exemplary embodiments have been presented above, it should be appreciated that many variations exist. Furthermore, while the description uses spin-torque MRAM devices that include memory cells in a specific example arrangements, the teachings may be applied to other memory devices having different architectures in which the same concepts can be applied. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method for accessing a selected memory cell that includes a magnetic tunnel junction in a magnetic memory, comprising:

driving a word line to a first word line voltage, wherein the word line is coupled to a set of selection transistors, wherein each selection transistor of the set of selection transistors is coupled between a first electrode of a corresponding magnetic tunnel junction in a corresponding memory cell of a set of memory cells and a local source line shared by the set of memory cells, wherein the selected memory cell is included in the set of memory cells;

after driving the word line to the first word line voltage, driving a plurality of bit lines to a first bit line voltage, wherein each bit line of the plurality of bit lines is coupled to a second electrode of a corresponding magnetic tunnel junction in a corresponding memory cell of the set of memory cells, wherein the first bit line voltage is different than the first word line voltage, and wherein driving the plurality of bit lines to the first bit line voltage adjusts voltage on the word line to a second word line voltage; and driving a selected bit line to a second bit line voltage, wherein the selected bit line is coupled to a second electrode of the magnetic tunnel junction included in the selected memory cell, wherein driving the selected bit line to the second bit line voltage results in a first current through the selected memory cell, wherein a fraction of the first current flows through each memory cell coupled to a corresponding bit line of the plurality of bit lines driven to the first bit line voltage.

2. The method of claim 1 further comprising, after driving the word line to the first word line voltage, isolating the word line to prevent circuitry used to drive the word line to the first word line voltage from further influence on the word line.

3. The method of claim 2, wherein isolating the word line further comprises reducing a gate voltage on a transistor gating a voltage to the word line such that the transistor behaves as a reverse-biased diode.

4. The method of claim 1, wherein the word line corresponds to a row of memory cells that includes the set of memory cells and additional sets of memory cells, and wherein driving the plurality of bit lines further comprises driving additional bit lines to a third bit line voltage, wherein each of the additional bit lines is coupled to a second electrode of a corresponding memory cell included in the additional sets of memory cells in the row to which the word line corresponds.

5. The method of claim 4, wherein the third bit line voltage and the first bit line voltage are about equal.

6. The method of claim 1, further comprising:
after driving the plurality of bit lines to a first bit line voltage, applying a supplemental voltage to the word line.

7. The method of claim 6, wherein the supplemental voltage is about equal to the second word line voltage.

8. The method of claim 6, wherein the supplemental voltage is different in magnitude from the second word line voltage.

9. The method of claim 1, wherein driving the selected bit line to the second bit line voltage results in the first current through the selected memory cell having a magnitude sufficient to write a new state to the selected memory cell, wherein the fraction of the first current is insufficient to write a new state in each of the memory cells coupled to a corresponding bit line of the plurality of bit lines driven to the first bit line voltage.

10. The method of claim 1 further comprising:
decoding a first portion of an address to determine first row selection information;
decoding a second portion of the address to determine second row selection information; and
wherein driving the word line to the first word line voltage includes selecting the first word line based on the first and second row selection information.

11. The method of claim 10 further comprises:
detecting a command corresponding to a bank in the magnetic memory, wherein the bank includes the set of memory cells that includes the selected memory cell; and
sampling the first row selection information based on the command.

12. The method of claim 10 further comprises driving at least one additional word line to a voltage that de-selects the at least one additional word line, wherein driving the at least one additional word line is based on the second row selection information.

13. A memory, comprising:
a first source line;
a first set of memory cells, each memory cell of the first set of memory cells including a magnetic tunnel junction;
a first plurality of bit lines;
a first set of selection transistors, wherein each selection transistor of the first set of selection transistors is coupled in series with a corresponding magnetic tunnel junction in a corresponding memory cell of the first set of memory cells, wherein each selection transistor and corresponding magnetic tunnel junction are coupled in series between the first source line and a corresponding bit line of the first plurality of bit lines;
a word line coupled to a gate of each selection transistor of the first set of selection transistors;
a word line driver coupled to the word line, wherein the word line driver is configured to drive the word line to a word line voltage;
first driver circuitry coupled to the first plurality of bit lines, the first driver circuitry configured to, after the word line driver has driven the word line to the word line voltage, drive each bit line of the first plurality of bit lines to a first bit line voltage, wherein the first bit line voltage is different than the first word line voltage, and wherein driving each bit line of the first plurality of bit lines to the first bit line voltage adjusts voltage on the word line to a second word line voltage;
a selected memory cell that includes a magnetic tunnel junction;
a bit line corresponding to the selected memory cell;
a selection transistor coupled in series with the magnetic tunnel junction of the selected memory cell, wherein the magnetic tunnel junction of the selected memory cell and the selection transistor are coupled in series between the bit line corresponding to the selected memory cell and the first source line; and
second driver circuitry configured to drive the bit line corresponding to the selected memory cell to a second bit line voltage, wherein driving the bit line corresponding to the selected memory cell to the second bit line voltage results in a current through the magnetic tunnel junction of the selected memory cell, wherein a fraction of the current flows through each magnetic tunnel junction included in the first set of memory cells.

14. The memory of claim 13 further comprising circuitry coupled to the word line, wherein the circuitry is configured to isolate the word line from the word line driver after the word line is driven to the word line voltage and before the first driver circuitry drives each bit line of the first plurality of bit lines to the first bit line voltage.

15. The memory of claim 13, further comprising:
a second source line;
a second set of memory cells, each memory cell of the second set of memory cells including a magnetic tunnel junction;
a second plurality of bit lines;
a second set of selection transistors, wherein each selection transistor of the second set of selection transistors is coupled in series with a corresponding magnetic tunnel junction in a corresponding memory cell of the second set of memory cells, wherein each selection transistor and corresponding magnetic tunnel junction is coupled between the second source line and a corresponding bit line of the second plurality of bit lines, wherein a gate of each selection transistor of the second set of selection transistors is coupled to the word line; and third driver circuitry coupled to the second plurality of bit lines, wherein the third driver circuitry is configured to drive each bit line of the second plurality of bit lines to a third bit line voltage.

16. The memory of claim 15, wherein the third bit line voltage and the first bit line voltage are about equal.

17. The memory of claim 13, further comprising:
a supplemental voltage provider coupled to the word line, wherein the supplemental voltage provider is configured to apply a supplemental voltage to the word line after the first plurality of bit lines are driven to the first bit line voltage.

18. The memory of claim 13, wherein the current has a magnitude sufficient to write a new state to the selected memory cell, and wherein the fraction of the current is insufficient to write a new state in each of the memory cells in the first set of memory cells.

19. A spin-torque magnetic memory, comprising:
a shared local source line;
a set of memory cells, wherein each memory cell of the set of memory cells is a spin-torque magnetic memory cell that includes a magnetic tunnel junction;
a plurality of bit lines;
a set of selection transistors, wherein each selection transistor of the set of selection transistors is coupled in series with a corresponding memory cell of the set of memory cells, wherein each selection transistor and corresponding memory cell are coupled in series between the shared local source line and a corresponding bit line of the plurality of bit lines;
a selected memory cell, wherein the selected memory cell is a spin-torque magnetic memory cell that includes a magnetic tunnel junction;
a bit line corresponding to the selected memory cell;
a selection transistor coupled in series with the selected memory cell, wherein the selected memory cell and the selection transistor are coupled in series between the bit line corresponding to the selected memory cell and the shared local source line;
a word line coupled to a gate of i) the selection transistor coupled in series with the selected memory cell and ii) each selection transistor of the set of selection transistors;
a word line driver coupled to the word line, wherein the word line driver is configured to drive the word line to a word line voltage;
first driver circuitry coupled to the plurality of bit lines, the first driver circuitry configured to, after the word line driver has driven the word line to the first word line voltage, drive each bit line of the plurality of bit lines to a first bit line voltage, wherein the first bit line voltage is different than the first word line voltage, and wherein driving each bit line of the plurality of bit lines to the first bit line voltage boosts voltage on the word line to a second word line voltage, wherein the second word line voltage is greater than the first word line voltage; and
second driver circuitry coupled to the bit line corresponding to the selected memory cell, the second driver circuitry configured to drive the bit line corresponding to the selected memory cell to a second bit line voltage, wherein driving the bit line corresponding to the selected memory cell to the second bit line voltage results in a current through the selected memory cell, wherein a fraction of the current flows through each memory cell of the set of memory cells.

20. The spin-torque magnetic memory of claim 19 further comprising a supplemental voltage provider coupled to the word line, wherein the supplemental voltage provider is configured to apply a supplemental voltage to the word line after the plurality of bit lines are driven to the first bit line voltage.

* * * * *